(12) United States Patent
Koller et al.

(10) Patent No.: US 11,361,598 B2
(45) Date of Patent: Jun. 14, 2022

(54) METHOD FOR MONITORING A MOTOR VEHICLE INCLUDING AN AUTOMATED DRIVING FUNCTION AND A DEVICE FOR CARRYING OUT THE METHOD

(71) Applicant: Robert Bosch GmbH, Stuttgart (DE)

(72) Inventors: Oliver Dieter Koller, Weinstadt (DE); Patrick Muenzing, Fellbach (DE); Juergen Motz, Steinheim An der Murr (DE); Marco Meissner, Stuttgart (DE); Martin Andreas Lohrmann, Stuttgart (DE); Frederic Heidinger, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 559 days.

(21) Appl. No.: 16/339,842

(22) PCT Filed: Oct. 17, 2017

(86) PCT No.: PCT/EP2017/076413
§ 371 (c)(1),
(2) Date: Apr. 5, 2019

(87) PCT Pub. No.: WO2018/077658
PCT Pub. Date: May 3, 2018

(65) Prior Publication Data
US 2020/0051345 A1 Feb. 13, 2020

(30) Foreign Application Priority Data

Oct. 28, 2016 (DE) .......................... 102016221334.2
Oct. 16, 2017 (DE) .......................... 102017218446.9

(51) Int. Cl.
*G07C 5/08* (2006.01)
*B60W 50/00* (2006.01)
(Continued)

(52) U.S. Cl.
CPC ............ *G07C 5/08* (2013.01); *B60W 50/0097* (2013.01); *B60W 50/023* (2013.01);
(Continued)

(58) Field of Classification Search
CPC combination set(s) only.
See application file for complete search history.

(56) References Cited

U.S. PATENT DOCUMENTS 6,211,681 B1 * 4/2001 Kagawa ................ B60L 3/0046
324/426
2010/0001523 A1 1/2010 Sato et al.
(Continued)

FOREIGN PATENT DOCUMENTS

CN 102112342 A 6/2011
CN 103963658 A 8/2014
(Continued)

OTHER PUBLICATIONS

International Search Report for PCT/EP2017/076413, dated Jan. 30, 2018.

*Primary Examiner* — Christian Chace
*Assistant Examiner* — Amelia Vorce
(74) *Attorney, Agent, or Firm* — Norton Rose Fulbright US LLP; Gerard Messina

(57) ABSTRACT

A method for monitoring a motor vehicle including an automated driving function, including differing modes of operation for bringing the motor vehicle to a standstill, at least one energy store, in particular a battery, supplying at least one consumer which is able to bring the vehicle to a standstill, a respective load profile being assigned to the respective mode of operation, which usually occurs in this mode of operation upon activation of the consumer, at least one characteristic variable of the energy store being predicted as a function of at least one of the load profiles, and (Continued)

the mode of operation associated with the load profile and/or the automated driving function being unblocked, blocked, left or influenced as a function of the predicted characteristic variable of the energy store.

19 Claims, 5 Drawing Sheets

(51) Int. Cl.
  *B60W 50/023* (2012.01)
  *G05D 1/00* (2006.01)
(52) U.S. Cl.
  CPC ... *B60W 2400/00* (2013.01); *B60W 2510/242* (2013.01); *G05D 1/0088* (2013.01)

(56) References Cited

U.S. PATENT DOCUMENTS

| | | | |
|---|---|---|---|
| 2010/0030431 A1 | 2/2010 | Potter | |
| 2010/0033132 A1* | 2/2010 | Nishi | B60L 58/40 320/136 |
| 2014/0210638 A1 | 7/2014 | Gussen et al. | |
| 2015/0105904 A1 | 4/2015 | Mou et al. | |
| 2015/0127425 A1* | 5/2015 | Greene | H02J 3/32 705/7.31 |
| 2015/0298680 A1* | 10/2015 | Matthews | B60W 10/06 701/22 |
| 2017/0008401 A1* | 1/2017 | Stemmer | B60T 13/586 |
| 2017/0057510 A1* | 3/2017 | Herbach | B62D 15/0265 |
| 2017/0063125 A1* | 3/2017 | Jezierski, Jr. | H02J 3/32 |
| 2018/0052463 A1* | 2/2018 | Mays | B60W 50/02 |
| 2018/0273195 A1* | 9/2018 | Woodhouse | G05D 1/105 |
| 2019/0054870 A1* | 2/2019 | Hida | H02J 1/08 |

FOREIGN PATENT DOCUMENTS

| | | |
|---|---|---|
| DE | 102008042121 A1 | 3/2010 |
| DE | 102010026772 A1 | 1/2012 |
| DE | 102012209627 A1 | 12/2013 |
| DE | 102012218737 A1 | 4/2014 |
| DE | 102013203661 A1 | 9/2014 |
| DE | 102014005767 A1 | 10/2014 |
| DE | 102015104104 A1 | 10/2015 |
| DE | 102014214103 A1 | 1/2016 |

\* cited by examiner

METHOD FOR MONITORING A MOTOR VEHICLE INCLUDING AN AUTOMATED DRIVING FUNCTION AND A DEVICE FOR CARRYING OUT THE METHOD

FIELD OF THE INVENTION

The present invention relates to a method for monitoring a motor vehicle including an automated driving function and to a device for carrying out the method. In the method, in particular safety-relevant functions of the vehicle electrical system are monitored.

BACKGROUND INFORMATION

In particular in automotive use, a vehicle electrical system or onboard electrical system shall be understood to collectively mean all electrical components in a motor vehicle. This encompasses both electrical consumers and supply sources, such as generators or electric stores, e.g., batteries. In the motor vehicle, care must be taken that electrical energy is available in such a way that the motor vehicle may be started at any time and that sufficient power supply is ensured during operation. However, electrical consumers should still be operable for an adequate time period also in the parked state, without a subsequent start being impaired.

The vehicle electrical system has the task of supplying the electrical consumers with energy. If the energy supply fails in today's vehicles due to a fault or aging in the vehicle electrical system or in a vehicle electrical system component, important functions, such as the power steering system, are not available. Since the ability to steer the vehicle is not impaired, but only becomes difficult to carry out, the failure of the vehicle electrical system in today's series-produced vehicles is generally accepted since the driver is available as a fallback level.

However, it should be noted that the increasing electrification of power units and the introduction of new driving functions result in higher requirements with regard to the safety and reliability of the electrical energy supply in the motor vehicle.

In future highly automated driving functions, such as an expressway pilot, the driver is permitted non-driving activities to a limited degree. From this it follows that the human driver is only able to perform the function as a sensory, control-technological, mechanical and energetic fallback level to a limited extent until the highly automated driving function has ended. The electrical supply thus has an unprecedented safety relevance in the motor vehicle during highly automated driving to ensure the sensory, control-technological and actuator-based fallback level. Faults or aging in the vehicle electrical system therefore must be identified reliably and may also be done completely within the meaning of product safety.

To be able to forecast the failure of components, reliability-related approaches for monitoring vehicle components were developed. For this purpose, the vehicle electrical system components are monitored during operation, and their damage is ascertained. Such a method is discussed in the publication DE 10 2013 203 661 A1, for example.

During a future automated and also autonomous driving operation in the motor vehicle, the driver is no longer, as is known, available as a sensory, control-technological, mechanical and energetic fallback level. The vehicle assumes the functions of the driver, such as the surroundings identification, the trajectories planning and the trajectories implementation, which, e.g., also encompass steering and braking.

If the energy supply of the safety-relevant components fails, the vehicle is no longer controllable by the highly/fully automated function since all above-described functions, such as the surroundings identification as well as trajectories planning and implementation, are no longer available. From the product safety perspective, this results in very high requirements with regard to the vehicle electrical system. This also means that the function of automated or autonomous driving may only be available to the user when the vehicle electrical system is, and in the near future also remains, in flawless condition.

The battery is or the batteries are one of the most important components in the vehicle electrical energy system, which ensure the energy supply in the vehicle and enable operating modes such as recuperation, sailing and boosting. Due to this special status in the vehicle electrical system, the analysis of the battery must be expanded.

A method for charging a battery of a vehicle is discussed in the publication DE 10 2012 209 627 A1. In this method, a battery management function and/or a safety function is/are carried out for at least one battery of a vehicle electrical system, a battery sensor being used.

The publication DE 10 2008 042 121 A1 discusses a method for monitoring an electrical system in a vehicle in which a battery sensor is utilized.

SUMMARY OF THE INVENTION

Against this background, a method as described herein is introduced. Specific embodiments are derived from the further descriptions herein.

The method for monitoring a motor vehicle including an automated driving function is used, in particular, to monitor and control or activate safety-relevant functions of the vehicle electrical system as a function of a state of a battery in this vehicle electrical system. Such a safety relevant function may be unblocked or blocked in the process. Such a function is, for example, the transition into the safe state in the event of a fault. The control or activation of a safety-relevant function may mean an unblocking or blocking of this function. According to the present invention, different modes of operation are provided for bringing the motor vehicle to a standstill. A load profile, which usually occurs in this mode of operation during the activation of the consumer, is assigned to the respective mode of operation. At least one characteristic variable of the energy store is predicted as a function of at least one of the load profiles, and the mode of operation associated with the load profile and/or the automated driving functions is/are unblocked, blocked, left or influenced as a function of the predicted characteristic variable of the energy store. In this way, faults or unsafe states of the vehicle electrical system which may possibly occur in the future may be identified already prior to their occurrence in a timely manner, and a safe selection of the suitable mode of operation may already be carried out in advance.

In one advantageous refinement at least two energy stores are provided, characteristic variables being predicted for each of the two energy store as a function of the load profile and, as a function thereof, associated modes of operation and/or automated driving functions being unblocked, blocked, left or influenced. For one, a redundant supply of important components and/or functions is made possible. By individually taking the respective energy stores into consideration, the permissible modes of operation may be ascertained more accurately. This enhances the operational safety of the automated driving functions.

Within the scope of the introduced method, it is provided to unblock certain functions for maintaining a safe mode of operation in vehicles including automated driving functions. This functionality is important in particular with automated driving since the driver is permitted to carry out non-driving activities and is not available as a fallback level. Consequently, the knowledge about the state or the prediction of the state of the battery is indispensable from the perspective of functional safety and for providing reliable systems. One example of a function in which a release or prevention may be implemented is the transition into the safe state, which is particularly gaining in importance in automated driving.

As a result, a system control unit is provided, which carries out a holistic state monitoring or status monitoring of all relevant components or systems in the vehicle. From the perspective of product safety, such a unit is absolutely necessary for safety-critical new applications having changed basic assumptions, such as automated driving. Wear-induced failures of components are known to be the basic cause for a majority of the vehicle electrical system states which are safety-relevant in the context of the new fields of applications, and therefore have to be preventatively identified in the vehicle and countermeasures have to be initiated. Since the energy store or the battery is one of the most important components in the vehicle electrical energy system, measures for the preventive battery analysis are described in the present invention, which are indispensable for implementing the new applications.

According to the present invention, a method for monitoring a vehicle electrical system in a motor vehicle including an automated driving function (for example according to SAE-J3016 or BaSt or NHTSA) is provided, in which the ability of one or multiple energy store(s) or battery/batteries is predicted, taking the instantaneous boundary conditions (aging, temperature, SOC and the like) into consideration, to bring the automated vehicle into a safe state. As a function of the predicted characteristic variables, according to the present invention automated driving functions are unblocked, blocked, left or degraded.

Particularly advantageously, so-called safe-stop scenarios (modes of operation for bringing a vehicle to a standstill) are checked based on the predicted state of the energy store and, based on this check, a safe-stop scenario is selected with the aid of which the motor vehicle is transferred into a safe state.

Particularly advantageously, in addition an energy management measure is carried out to improve the vehicle electrical system stability and/or degrade the automated driving function. In one advantageous refinement, additionally faults and their effect on the state of the energy store are taken into consideration. Particularly advantageously, the driver receives a warning about the critical state. In addition, the driver may be prompted to assume control of the vehicle. In one advantageous refinement, the load profile is predefined as a function of the state of the vehicle electrical system, in particular a fault and/or a loading of the vehicle electrical system and/or a state of the load.

A device may be configured to provide feedback from a monitoring unit, for example a battery sensor, to a higher-level control unit to unblock, block, leave or degrade the automated driving functions. As an alternative, feedback of the higher-level control unit may be provided to the monitoring unit regarding the adapted load profiles for the corresponding safe-stop scenarios.

Advantages of the described method and of the described device, at least in some of the embodiments, are:
  Assistance or support for the unblocking and unblock decision for automated driving functions:
  Aging effects in the battery result in the withdrawal of the unblocking or in the leaving of the driving functions, such as automated driving, or in the withdrawal of the unblocking or in the leaving of certain modes of operation, e.g., sailing, or in the transition into the safe state to avoid safety-critical states.
  Increase in reliability due to adapted driving strategies:
  Driving situations which, from the system perspective during operation result in significant aging behavior of the battery, are avoided if possible.
  Increase in availability:
  A preventive battery replacement may be carried out in a timely manner prior to an uncontrolled battery failure, e.g., at regular maintenance intervals.
  Gain in safety during the transfer from the automated driving operation into the manual driving operation:
  Due to early warning of a battery failure, the vehicle transfer can be carried out in a situation which is easier for the driver to handle.
  Absolute necessity to bring the vehicle into a safe state without the intervention of a driver during fully automated driving, even in the case of the failure of components.
  Time gained during the initiation of the fallback strategy due to early warning or no unblocking of the driving functions in the case of an imminent battery failure and avoidance of an undesirable vehicle electrical system failure by checking which safe-stop scenario is still permissible from a battery perspective.
  Increase in the reliability and the safety also of non-automated vehicles by early identification of imminent failures, whereby it is also possible to avoid broken-down vehicles in driving lanes, e.g., on expressways.

Further advantages and embodiments of the present invention are derived from the description and the accompanying drawings.

It shall be understood that the above-mentioned features and those still to be described hereafter may be used not only in the particular described combination, but also in other combinations, or alone, without departing from the scope of the present invention.

The present invention is schematically shown in the drawings based on specific embodiments and is described in greater detail hereafter with reference to the drawings.

DETAILED DESCRIPTION

In the exemplary embodiment, a battery is described as a possible energy store by way of example. As an alternative, however, other energy stores suitable for this task may likewise be used, for example inductively or capacitively based, fuel cells, capacitors or the like.

Figure 1:
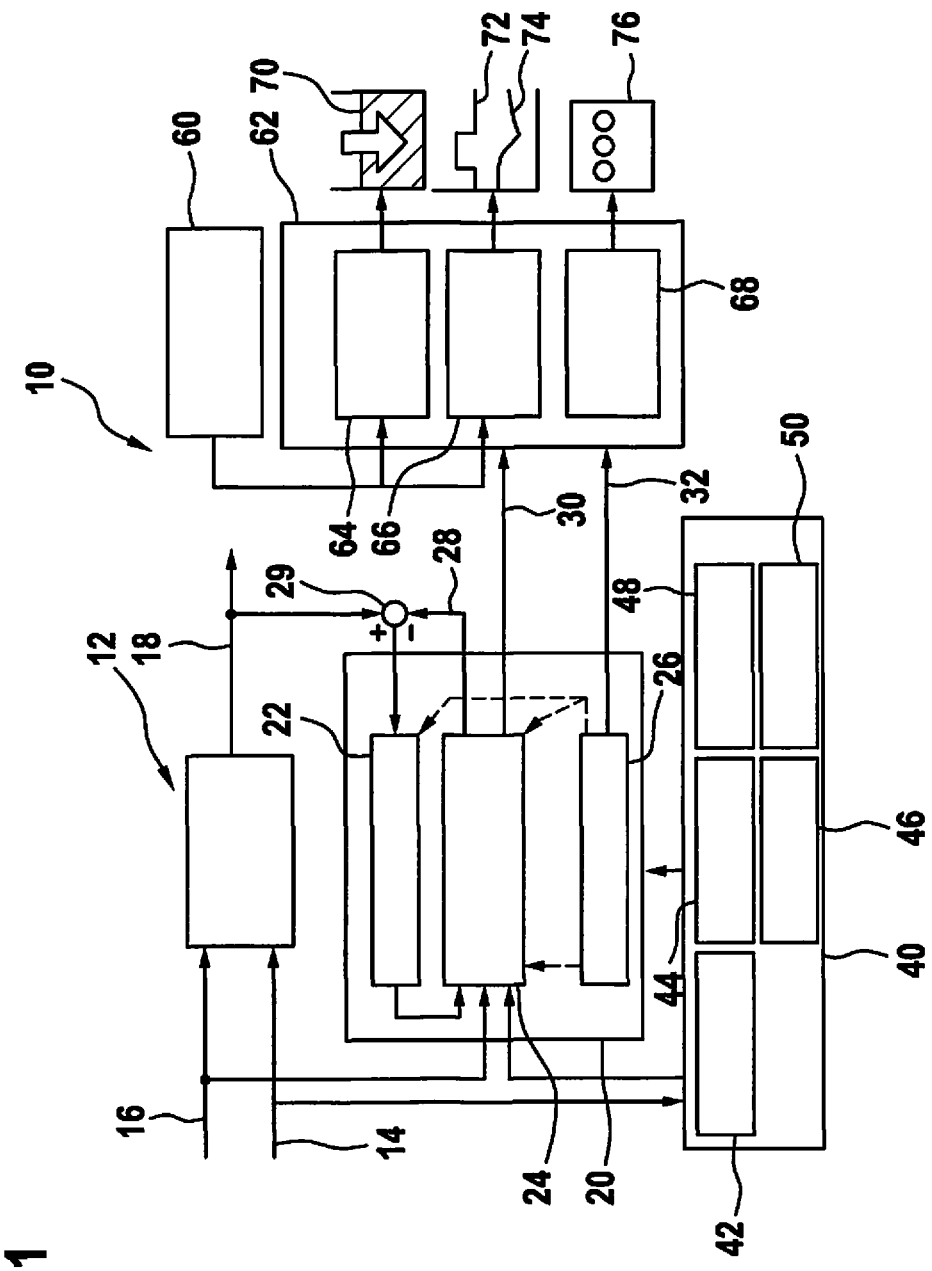
FIG. 1 shows one embodiment of a battery sensor.

FIG. 1 shows a battery sensor denoted overall by reference numeral 10. Input variables in a unit 12, in particular a measuring unit, are temperature T 14 and current I 16, and the output variable is voltage U 18.

In a block 20, parameters and states are estimated. A feedback unit 22, a battery model 24 and an adaptation 26 of the parameters are provided therein. A variable û 28, state variables ˆx 30 and model parameters ˆp 32 are output.

A node 29 is used to adapt battery model 24 to the battery. Current I 16 is incorporated directly and temperature T 14 is incorporated indirectly in battery model 24. This calculates û 28 and compares this to real voltage U 18. In case of deviations, battery model 24 is corrected with the aid of feedback unit 22.

Moreover, a block 40 for sub-algorithms is provided. This includes a battery temperature model 42, an open circuit voltage 44, a peak current measurement 46, an adaptive starting current prediction 48 and a battery size detection 50.

In addition, load profiles 60 are provided, which are incorporated in a block 62 including predictors. These are a charge predictor 64, a voltage predictor 66 and an aging predictor 68. Outputs of block 62 are an SOC 70, curves of current 72 and voltage 74 and an SOH 76.

Battery sensor 10 thus ascertains instantaneous SOC 70 (state of charge) of the battery and instantaneous SOH 76 (state of health, loss of capacitance compared to the initial state) of the battery. With the aid of predictors 64, 66, 68, battery sensor 10 is able to predict SOC 70 and SOH 76 according to multiple previously defined loading scenarios. These may now also be adapted to automated driving or to the respective application. In particular, predictors 64, 66, 68, resorting to a typical loading event (based on certain load profiles 141) of an associated mode of operation (SSL 1, SSL 2, SSL 3) for bringing a vehicle to a standstill, are able to predict at least one certain characteristic variable of battery 106, 110 (forecast it with the aid of a simulation). Different modes of operation (SSL 1, SSL 2, SSL 3) may be provided to bring the vehicle to a standstill and thereby achieve a safe operating state of the motor vehicle (safe stop level). A respective load profile 141 is assigned to each of these different modes of operation (SSL 1, SSL 2, SSL 3). At the respective loading 141, the instantaneous battery state is simulated and its effects on the predicted characteristic variable of battery 106, 110 (such as SOC, SOH and the SOF (state of function describes the performance capability of the battery and provides information as to the level of power which the energy store can supply to the consumer)) are ascertained. If load profile 141 in the simulation causes the characteristic variable to drop below certain limiting values, respective mode of operation SSL linked to simulated load profile 141 is blocked.

Figure 2:
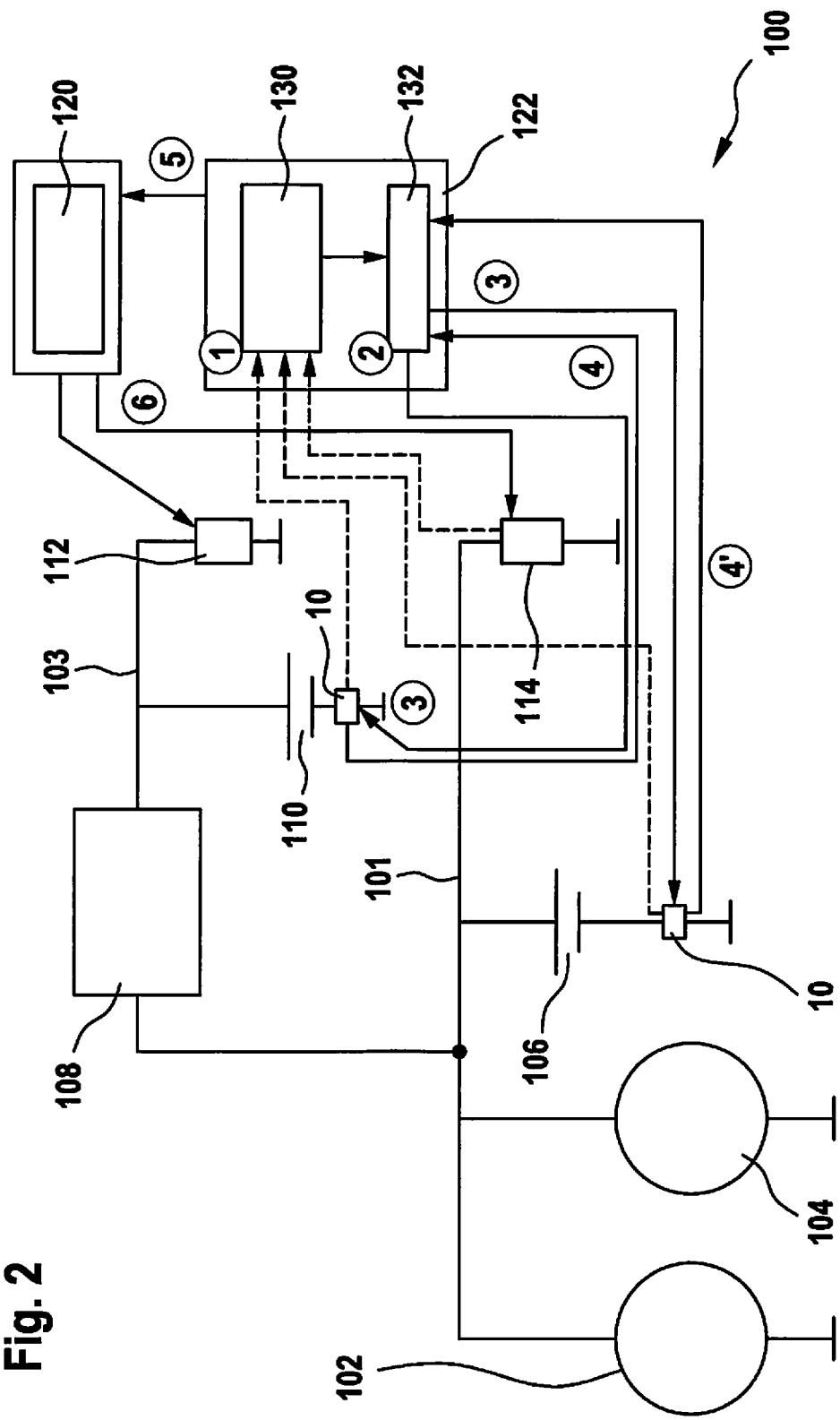
FIG. 2 shows the concept of one embodiment of the function of a battery sensor.

FIG. 2 shows one embodiment of the overall concept, integrating the battery sensor function. The illustration shows a vehicle electrical system 100 including a generator 102, a starter 104, a first battery 106 including an assigned battery sensor 10, a DC-DC converter 108, a second battery 110 including an assigned further battery sensor 10, a first consumer 112 and a second consumer 114. Shown consumers 112 and 114 each representatively denote one or multiple consumer(s). By way of example, a second consumer 114 is fed by a first channel 101, which is connected to first battery 106. First consumer 112 is fed by a second channel 103, which is connected to second battery 110. One battery sensor 10 monitors one battery 106. Further battery sensor 10 monitors further battery 110. Moreover, a system control unit 120 and a safety management unit 122 including a system diagnosis unit 130 and a fault identification unit 132 are provided. Battery sensor or sensors 10 may be configured, by way of example, as shown in FIG. 1. In particular for the automated driving, different loading scenarios, which are previously defined in the form of load profiles 141, of different modes of operation SSL, which are necessary for safely stopping the vehicle, are used. Such different loading scenarios are shown, by way of example, for three different modes of operation SSL 1, SSL 2, SSL 3 for effectuating a safe stop of the vehicle in FIG. 5, as is described in greater detail hereafter.

Based on the algorithms present in battery sensor 10, unblockings are implemented, for example, in battery sensor 10 or else in another control unit (for example in system control unit 120 or safety management unit 122, for trajectories planning 155 or another vehicle control unit). The instantaneous state, i.e., SOC, SOH, aging etc., of battery 106, 110 and their boundary conditions, such as temperature 14, are taken into consideration in the forecast of the future state in the form of an appropriate characteristic variable, for example after the transition into the safe state. For this purpose, the loading, current, voltage and/or temperature profiles of the scenarios are stored in battery sensor 10, and the behavior is simulated while the scenarios are being carried out or after they have been carried out. In the exemplary embodiment, different current profiles are used as load profiles 141 by way of example. Predicted characteristic variable or characteristic variables SOC, SOF, SOH, battery voltage U etc. of battery 106, 110 during or after considered mode of operation SSL 1, SSL 2, SSL 3 is obtained as the result of the simulation, using battery model 24. This predicted characteristic variable on battery 106, 110 is compared to at least one predefined limiting value, which represents a minimum requirement of the required component or consumer 112, 114 (taking the wiring harness resistance of vehicle electrical system 100 into consideration), and associated mode of operation SSL 1, SSL 2, SSL 3 is unblocked or blocked (when a drop below the minimum requirements occurs). As an alternative, corresponding mode of operation SSL may be adapted. This could take place, for example, by changing the driving speed or carrying out slower braking. With this, the associated load profile 141 is changed in such a way that the characteristic variable no longer drops below the permissible limiting value.

1. Unblocking different modes of operation SSL 1, SSL 2, SSL 3 for bringing the vehicle to a standstill or transferring it into the safe state:

In this function, the different modes of operation SSL, if necessary with energy management (EEM) measures, such as load connections and/or disconnections, are impressed in battery sensor 10, for example as load profiles 141 (loading, current, voltage and/or temperature profiles). With the aid of predictors 64, 66, 68, the characteristic variable (for example SOC, SOF, SOH, battery voltage U) of battery 106, 110 is ascertained during or after the considered scenario. If a drop occurs below certain values, e.g., established based on the voltage limits of safety-relevant consumers 112, 114, if necessary taking the losses of the underlying topology into consideration, respective mode of operation SSL is blocked.

2. Unblocking different modes of operation SSL, if necessary with EEM measures, and faults:

In this function, faults which may occur in vehicle electrical system 100, in combination with different modes of operation SSL, if necessary with EEM measures, such as load connections and/or disconnections, are impressed in battery sensor 10, for example as loading, current, voltage and/or temperature profiles. With the aid of predictors 64,

66, 68, characteristic variables SOC, SOF, SOH, battery voltage U of the battery are ascertained or predicted during or after the considered scenario. If a drop occurs below certain values, e.g., established based on the voltage limits of safety-relevant consumers, taking the losses of the underlying topology into consideration, the respective combination of considered faults is blocked in considered mode of operation SSL.

Possible consumers 112, 114 are those which are necessary to transfer the vehicle into a safe operating state, in particular for carrying out the above-described modes of operation SSL 1, SSL 2, SSL 3, using corresponding load profiles 142, 145, 151. These necessary consumers 112, 114 are, for example, actuators for activating braking system and/or steering system and/or a surroundings sensor system and/or a trajectories planning unit.

In particular, redundant vehicle electrical energy systems are used during automated driving. This is expressed in FIG. 2 in that two sub-networks including two channels 101, 103 which may be supplied independently of one another are provided. For example, two channels 101, 103 are connected to one another by a DC-DC converter 108 to enable an energy exchange. Each of these sub-networks or channels 101, 103 includes a respective energy store, for example a battery 106, 110, which is able to supply associated consumer(s) 112 or 114 with energy. Consumers which are necessary for a certain driving function may have a redundant design, for example braking system and/or steering system and/or surroundings sensor system and/or trajectories planning unit. In this way, braking system may include at least two components (for example an electronic stability program (ESP) and a so-called iBooster (a system for the electromechanical braking pressure generation), which are supplied by different channels 101, 103. In this way, it is ensured that safe deceleration of the vehicle remains possible if one channel 101, 103 fails. Steering system thus also includes two redundant components, which are each supplied by different channels 101, 103. Operating interfaces are also provided, which are each supplied by two channels 101, 103. Moreover, sensors and processing units are provided for detecting the surroundings sensor system and calculating the trajectories or other intervention for stopping the vehicle in a targeted manner. These sensors and processing units also have a redundant design and are supplied with energy by different channels 101, 103.

If a fault occurs in one of the sub-systems of the vehicle electrical energy system, the vehicle must automatically achieve a safe state. For this purpose, the ability of battery 106, 110 of the fault-free sub-system must ensure that the vehicle is brought into the safe state. Battery sensor 10 is used to monitor battery 106, 110. If battery sensor 10 identifies that one battery 106, 110 is no longer able to ensure the transition into the safe state, this must be identified and relayed to a higher-level control unit, such as system control unit 120 or safety management unit 122, for example. Based on the information, the corresponding driving function is blocked or left or degraded.

A possible sequence is illustrated in FIG. 2 with shown numerals and is as follows:

1. Battery sensor 10 (EBS) and/or other sensors or components supply physical state variables to system diagnosis unit 130 of safety management unit 122, which may be part of system control unit 120.
2. Faults are identified with the aid of a plausibility check of the physical characteristic variables.

Alternative: Faults are identified by the component itself and reported to safety management unit 122.

3. Safety management unit 122 reports the fault to battery sensor 10.
4. The battery sensor or sensors 10 analyze(s) which modes of operation SSL are still possible under these conditions, and report these modes of operation SSL for each battery 106, 110 to safety management unit 122.
5. Safety management unit 122 consolidates the pieces of information of battery sensors 10 and of the other components and transfers still-drivable modes of operation SSL to system control unit 120.
6. System control unit 120 initiates the transition into the safe state by a mode of operation SSL identified as permissible by appropriately activating the actuators when certain conditions (for example identified faults) are present.

Figure 3:
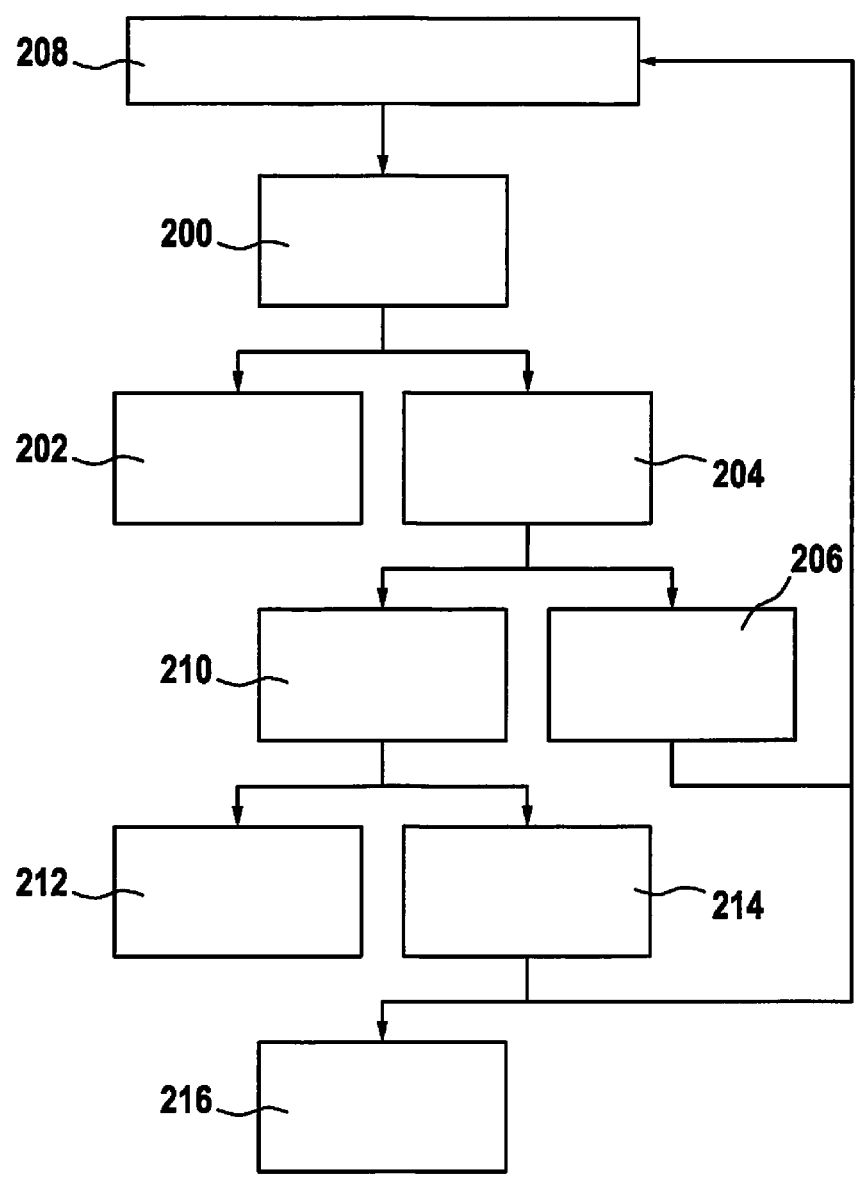
FIG. 3 shows one embodiment of the introduced method in a flow chart.

A possible sequence for unblocking certain modes of operation SSL (safe-stop levels, i.e., transitions into the safe state) is shown in FIG. 3.

In a first step 200, it is checked whether respective mode of operation SSL or safe-stop scenario never results in a failure. If this is true, this mode of operation SSL or safe-stop scenario is set without an EEM measure in a step 202. If this is incorrect, it is checked in a step 204 whether this mode of operation SSL or safe-stop scenario always results in failure. If this is true, a loop 206 with a next SSL or safe-stop scenario and a loop 208 via SSL or safe-stop scenarios are carried out, starting with a critical state. The sequence then begins again with step 200.

If the check in step 204 shows this is incorrect, it is checked in step 210 whether mode of operation SSL results in failure under high load, but not under low load. If the check shows this is true, in a step 212 this mode of operation SSL or safe-stop scenario and an EEM measure, for example a load disconnection, are set. If the check in step 210 shows this is incorrect, it is checked in a step 214 whether mode of operation SSL results in failure under low load and does not under high load. If this shows this is true, in a step 216 this mode of operation SSL or safe-stop scenario and an EEM measure, for example a load connection, are set. If the check in step 214 shows this is incorrect, the next mode of operation SSL2 or safe-stop scenario is checked, and a jump to step 208 is made.

When the introduced method is carried out, it is started in an embodiment of the "most comfortable" mode of operation SSL for the driver. For this purpose, associated load profiles 141 (loading, current, voltage and/or temperature profiles, if necessary with an EEM measure) are impressed in predictor 62, 64, 66, 68 of battery sensor 10. Such load profiles 141 are shown by way of example in FIG. 5 for three possible modes of operation SSL 1, SSL 2, SSL 3. Predictor 62, 64, 66, 68 ascertains from respective load profiles 141, 142, 145, 151 the expected (predicted) curve of the characteristic variable of the battery state and, if necessary, of other important characteristic variables. Examples of these characteristic variables are the SOC, SOF, SOH and/or the voltage at battery 106, 110. Over the course of or at the end of the simulation, the simulated characteristic variables are compared to limiting values, and mode of operation SSL 1, SSL 2, SSL 3 linked to respective load profile 141, 142, 145, 151 underlying the simulation is or is not unblocked. If a mode of operation SSL is not unblocked, the next mode of operation SSL 2 is selected for the simulation with associated load profile 145. This is carried out until a possible mode of operation SSL has been found, or all possible modes of operation SSL have been tested. The transfer of the analysis results takes place, e.g., to a higher-level control unit in the form of an unblocking vector regarding which modes of operation SSL each allow safe stopping of the vehicle.

In addition to the procedure described above, faults and their effects on the curve of the characteristic variable of the battery state or the curve of the battery voltage may be taken into consideration in the simulation with the respective load profiles 141, 142, 145, 151. A distinction may be made between two options here:

Option 1:

As a precautionary measure, all faults are always impressed during the simulation according to the above-described procedure, in addition to modes of operation SSL and the EEM measure. The drivable modes of operation SSL are ascertained in combination with the considered fault and, e.g., transferred with the aid of a vector to a higher-level control unit.

It is advantageous that the pieces of information regarding which modes of operation SSL are drivable in which fault case are permanently present. It should be noted that a permanently high computing power is required for this purpose.

Option 2:

A fault is identified in vehicle electrical system 100, and it is checked according to the above-described procedure, while additionally impressing the identified fault, as to which mode of operation SSL is still drivable with this combination of fault and SSL and EEM measure.

It is advantageous that only the relevant fault is simulated. The computing power may thus be optimally utilized. It should be noted that the calculation is only carried out when the fault has already occurred. This must be noted, in particular, for time critical applications.

Figure 4:
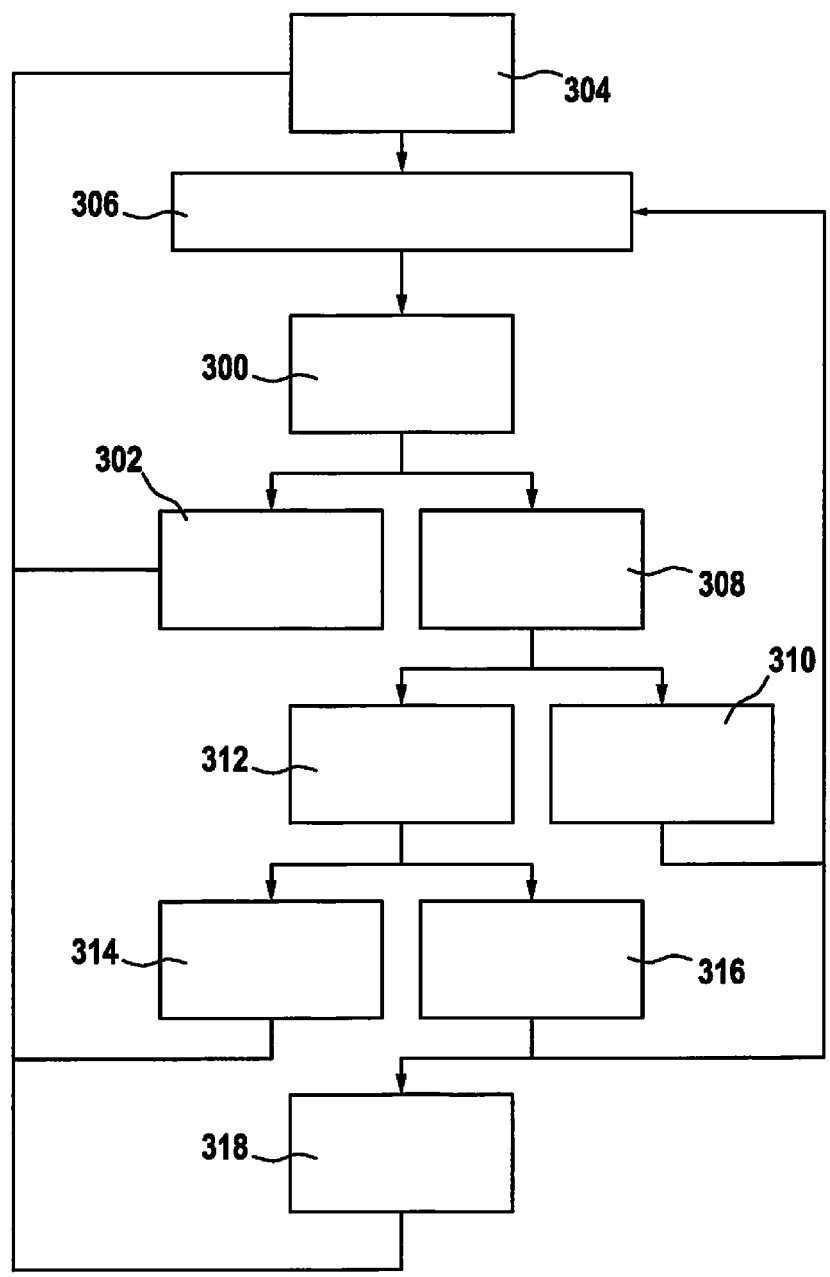
FIG. 4 shows one further embodiment of the introduced method in a flow chart.

FIG. 4 shows a possible sequence for ascertaining a drivable mode of operation SSL. In a first step 300, it is checked whether the combination of fault and considered mode of operation SSL never results in failure. If this is the case, this mode of operation SSL is set without an EEM measure in a step 302. Then, the next fault is checked in a loop 304 for all faults and a loop 306 for possible modes of operation SSL or safe-stop scenarios, starting with a critical state.

If the check in step 300 shows this is incorrect, it is checked in a step 308 whether the combination of fault and mode of operation SSL always results in failure. If this is the case, a loop 310 is carried out with next mode of operation SSL, and a jump is made to loop 306. If the check in step 308 shows this is true, it is checked in a step 312 whether the combination of fault and this mode of operation SSL results in failure under high load, and does not under low load. If this is the case, this mode of operation SSL and an EEM measure, such as a load disconnection, are set in a step 314. Then, the next fault is checked, and a jump is made to loop 304. If the check in step 312 shows this is incorrect, it is checked in a step 316 whether the combination of fault and mode of operation SSL results in failure under low load, and does not under high load. If this is the case, corresponding mode of operation SSL and an EEM measure, such as a load connection, are set in a step 318. If this is not the case, next mode of operation SSL is checked, and a jump is made to loop 306.

Figure 5:
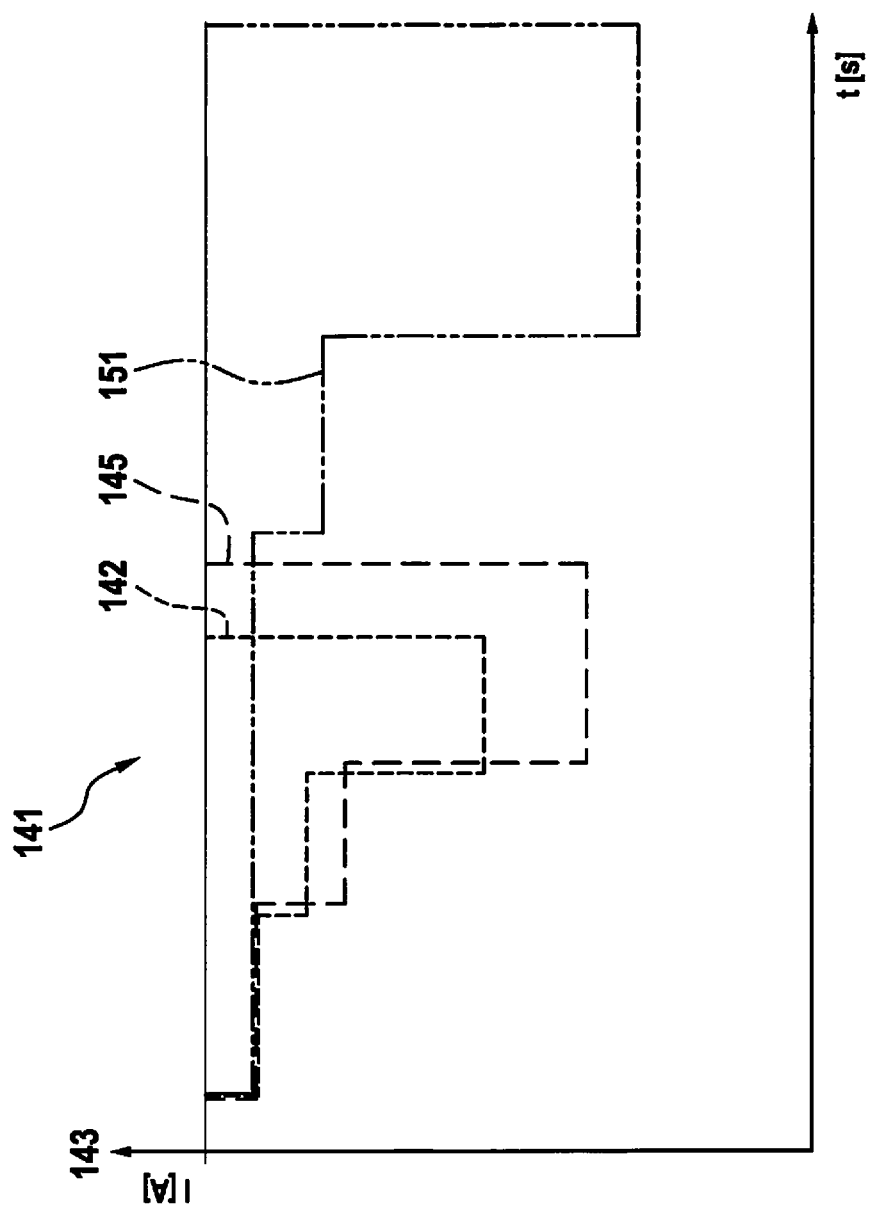
FIG. 5 shows different load profiles.

By way of example, three load profiles 142, 145, 151 of three different modes of operation SSL 1, SSL 2, SSL 3 for transferring a vehicle into the safe state are now shown in FIG. 5. In a first load profile 142 of a first mode of operation SSL1 into the safe state an emergency stop is carried out by a pure brake application of the vehicle, without a steering maneuver. In this way, for example, the brake pressure may be built up slowly for low deceleration and keeping in the lane. Due to the short duration, this first mode of operation SSL1 requires little energy and little electrical power since no dynamic driving maneuvers have to be carried out.

Typically, this is a simplified load profile 141, in particular a current profile at an instantaneously measured temperature 14 and an instantaneous battery state, which reflects the maximum occurring loading during this driving maneuver. For example, load profile 141 is broken down into three discrete stages made up of differing load currents and loading durations. In a first stage, the load profile has a basic load current for a certain duration dt1. For a certain further duration dt2 (for example 5 s), the current of the load profile increases to an actuator current (for example 50 A). Afterwards, a peak current (for example 95 A) may flow for a further duration dt2 (for example 50 ms) and thus end the load profile.

A corresponding load profile 142 of a first transition SSL1 into the safe state of the vehicle is shown in FIG. 5. Load profile 142 is plotted in the form of a time curve of load current 143, for example. In the exemplary embodiment according to FIG. 5, load profile 142 is characterized by an incremental activation of brake with the associated load current. For example, the activation takes place in 3 stages. The vehicle comes to a halt after a relatively short time, so that at this point in time no further activation of braking system is required.

In a second mode of operation SSL2, an emergency stop of the vehicle in the lane is carried out. This is accompanied by an activation of both braking system and steering system. For example, a fast pressure buildup, an ABS control and a stopping in the lane are carried out. The duration of the maneuver is relatively short, but energy is required for the brake pressure modulation. Moreover, current peaks occur in the ESP due to the pressure modulation, during which battery 106, 110 briefly must provide high power. This manifests itself in the shown further load profile 145, which is assigned to second mode of operation SSL2. A higher load current 143 results in the exemplary embodiment according to FIG. 5 than during pure braking according to first load profile 142. By way of example, it also takes longer for the vehicle to stop.

In a third transition into safe state SSL3, the stopping of the vehicle takes place, for example, on the shoulder or in the right lane. For this purpose, steering system must be activated according to a trajectories planning unit 151, which ascertains the appropriate trajectories for reaching the right lane or the shoulder as a function of a surroundings sensor system. An appropriate activation of braking system takes place in parallel. According to a third load profile 151 assigned to third mode of operation SSL3, this procedure takes accordingly longer. Load current 143 is greater. The corresponding energy content for carrying out third transition 151 is also greater than in the two preceding load profiles 142, 145.

It shall be mentioned that the described possible modes of operation SSL1, SSL2, SSL3, each having assigned load profiles 142, 145, 151 for reaching a safe state of the vehicle, are only mentioned by way of example. As an alternative, further modes of operation would also be conceivable, such as a stopping of the vehicle only at the next rest stop or the next repair shop or the like. Corresponding load profiles 141 would have to be adapted accordingly. The subsequent simulation of a characteristic variable of the battery state based on different load profiles 141, however, would be carried out accordingly.

Based on different load profiles 142, 145, 151, a simulation is carried out, using battery model 28 stored in battery sensor 10, for example, for the respective energy store. Battery model 28 could be based on an electrical equivalent circuit model of the energy store for this purpose, for example suitably using an RC network, for example implemented by appropriate digital signal processing. The result of the simulation is, for example, a minimum voltage which may occur during the associated maneuver on battery 106, 110. The minimum voltage on battery 106, 110 is compared to the minimum requirements of the required components or consumers 112, 114 or braking system, steering system, surroundings sensor system, trajectories planning unit (if necessary, taking the wiring harness resistance into consideration). When a drop below the minimum requirements occurs for the corresponding driving function, it is blocked or left or the driving strategy is adapted accordingly.

In principle, the key is to carry out the described simulation prior to any unblocking for automated driving in which it is ascertained, taking different input parameters (temperature, SOC, basic load, if necessary faults etc.) into consideration, as to whether at least one mode of operation SSL is available for transferring the vehicle back into a safe state in the event of an emergency during autonomous operation.

As an alternative or in addition, this prediction may be carried out cyclically during the autonomous operating mode. If it is no longer possible, e.g., to drive to the roadside, the algorithm offers the information as to whether instead at least a stopping in the lane may be enabled by battery 106, 110 or whether an immediate emergency stop must be initiated.

In the exemplary embodiment according to FIG. 2, two channels 101, 103 are provided, which supply safety-relevant consumers 112, 114. The above-described unblocking of different modes of operation SSL 1, SSL 2, SSL 3 is now carried out for each channel 101, 103 or for each of batteries 106, 110 situated in these channels 101, 103. The prediction of the characteristic variable thus takes place as a function of different modes of operation SSL for first battery 106 or first channel 101 by battery sensor 10, which ascertains the battery state of first battery 106. In this way, certain modes of operation SSL 1, SSL 2, SSL 3 are unblocked or blocked for first channel 101. This information is shared with safety management unit 122, as was already described. Accordingly, the prediction of the characteristic variable for further battery 110 takes place by battery sensor 10, which ascertains the battery state of further battery 110. Accordingly, modes of operation SSL 1, SSL 2, SSL 3 are unblocked or blocked for further channel 103. This information is also shared with safety management unit 122. In this way, the pieces of information regarding the unblocking or blocking for the respective modes of operation SSL are available for both channels 101, 103. If a fault is now present in first channel 101, for example, system control unit 120 selects the suitable unblocked mode of operation SSL for further channel 103. System control unit 120 accordingly activates consumers(s) 112 fed by further channel 103 for achieving unblocked mode of operation SSL.

The described method is suitable, in particular, for vehicles in which vehicle electrical system 100 has a high safety relevance. This is the case, for example, in vehicles including automated driving functions.

What is claimed is:

1. A method for monitoring a motor vehicle including an automated driving function, including different modes of operation for bringing the motor vehicle to a standstill, the method comprising:
    assigning a respective load profile to a respective mode of operation, which occurs upon activation of at least one consumer which is able to bring the vehicle to a standstill, wherein at least one energy store is able to supply the at least one consumer; and
    predicting at least one characteristic variable of the energy store as a function of the respective load profile;
    wherein the mode of operation associated with the load profile and/or the automated driving function is unblocked, blocked, disregarded or adapted as a function of the predicted characteristic variable of the energy store.

2. The method of claim 1, wherein at least two energy stores are provided for a redundant supply of the consumer and/or for the supply of a further consumer which is able to bring the vehicle to a standstill, and, characteristic variables are predicted for each of the two energy stores as a function of the load profile, the associated mode of operation and/or automated driving function being unblocked, blocked, disregarded or adapted as a function of the characteristic variables.

3. The method of claim 1, wherein the load profile is predefined as a function of the state of the vehicle electrical system, and/or a state of the load.

4. The method of claim 1, wherein the characteristic variable of the energy store is ascertained as a function of a model of the energy store.

5. The method of claim 1, wherein a characteristic variable of a further energy store is predicted as a function of a model of the further energy store, and the mode of operation associated with the load profile and/or the automated driving function is unblocked, blocked, disregarded or adapted as a function of the predicted characteristic variable of the further energy store.

6. The method of claim 1, wherein the mode of operation regarding the energy store relates to at least one such consumer which is supplied by the energy store.

7. The method of claim 1, wherein a battery sensor predicts the characteristic variable of the energy store for which characteristic variables are detected by the battery sensor.

8. The method of claim 1, wherein an instantaneous state of the energy store, including at least one of a state of charge, a temperature, a voltage, a current, an internal resistance, is used for ascertaining the characteristic variable of the energy store.

9. The method of claim 1, wherein the load profile is varied as a function of at least one fault in the vehicle electrical system or on a consumer.

10. The method of claim 1, wherein the load profile is varied as a function of at least one load state in the vehicle electrical system.

11. The method of claim 1, wherein at least one piece of information for at least one mode of operation is stored as to whether this mode of operation may be used to bring the vehicle into a safe state.

12. The method of claim 1, wherein, in a critical state in which the vehicle must be brought to a standstill, such a mode of operation is selected which was ascertained during a prior check based on the load profile.

13. The method of claim 1, wherein the characteristic variable of the battery is compared to at least one limiting value and, as a function of the comparison to the limiting value, the associated mode of operation and/or automated driving functions is unblocked, blocked, disregarded or adapted.

14. A device for monitoring a motor vehicle including an automated driving function, including different modes of operation for bringing the motor vehicle to a standstill, comprising:
 a monitoring apparatus configured to perform the following:
  assigning a respective load profile to a respective mode of operation, which occurs upon activation of at least one consumer which is able to bring the vehicle to a standstill, wherein at least one energy store is able to supply the at least one consumer; and
  predicting, via at least one battery sensor, at least one characteristic variable of the energy store as a function of the respective load profile;
  wherein the mode of operation associated with the load profile and/or the automated driving function is unblocked, blocked, disregarded or adapted as a function of the predicted characteristic variable of the energy store.

15. The method of claim 1, wherein at least one energy store includes a battery.

16. The method of claim 1, wherein at least two energy stores, which include batteries, are provided for a redundant supply of the consumer and/or for the supply of a further consumer which is able to bring the vehicle to a standstill, and, characteristic variables are predicted for each of the two energy stores as a function of the load profile, the associated mode of operation and/or automated driving function being unblocked, blocked, disregarded or adapted as a function of the characteristic variables.

17. The method of claim 1, wherein the load profile is predefined as a function of the state of the vehicle electrical system, in particular a fault and/or a loading of the vehicle electrical system, and/or a state of the load.

18. The method of claim 1, wherein the characteristic variable of the energy store is ascertained as a function of a model of the energy store, which is stored in a battery sensor.

19. The method of claim 1, wherein at least one piece of information for at least one mode of operation is stored as to whether this mode of operation may be used to bring the vehicle into a safe state, including a standstill.

* * * * *